(12) United States Patent
Darwish

(10) Patent No.: US 6,569,738 B2
(45) Date of Patent: May 27, 2003

(54) PROCESS FOR MANUFACTURING TRENCH GATED MOSFET HAVING DRAIN/DRIFT REGION

(75) Inventor: Mohamed N. Darwish, Saratoga, CA (US)

(73) Assignee: Siliconix, Inc., Santa Clara, CA (US)

( * ) Notice: Subject to any disclaimer, the term of this patent is extended or adjusted under 35 U.S.C. 154(b) by 0 days.

(21) Appl. No.: 09/898,652

(22) Filed: Jul. 3, 2001

(65) Prior Publication Data

US 2003/0006454 A1 Jan. 9, 2003

(51) Int. Cl.$^7$ ............................................. H01L 21/336
(52) U.S. Cl. ...................... 438/270; 438/268; 438/558
(58) Field of Search ................................. 438/268, 270, 438/271, 272, 558

(56) References Cited

U.S. PATENT DOCUMENTS

| | | | | |
|---|---|---|---|---|
| 4,689,871 A | * | 9/1987 | Malhi ................ | 148/DIG. 131 |
| 5,021,355 A | * | 6/1991 | Dhong et al. ............... | 438/270 |
| 5,250,450 A | * | 10/1993 | Lee et al. .................... | 257/327 |
| 5,424,231 A | * | 6/1995 | Yang .................. | 148/DIG. 126 |
| 5,559,357 A | * | 9/1996 | Krivokapic ................... | 257/333 |
| 6,084,264 A | * | 7/2000 | Darwish ...................... | 257/329 |
| 6,191,446 B1 | * | 2/2001 | Gardner et al. ............ | 257/330 |
| 6,329,271 B1 | * | 12/2001 | Akatsu et al. .............. | 257/336 |
| 6,376,313 B1 | * | 4/2002 | Goebel et al. .............. | 257/330 |
| 2001/0004540 A1 | * | 6/2001 | Bronner et al. ............. | 438/270 |

* cited by examiner

Primary Examiner—John F. Niebling
Assistant Examiner—Angel Roman

(57) ABSTRACT

A trench MOSFET is formed in a structure which includes a P-type epitaxial layer overlying an N+ substrate. An N-type dopant is implanted through the bottom of the trench into the P-epitaxial layer to form a buried layer below the trench, and after a up-diffusion step a N drain-drift region extends between the N+ substrate and the bottom of the trench. The result is a more controllable doping profile of the N-type dopant below the trench. The body region may also be formed by implanting P-type dopant into the epitaxial layer, in which case the background doping of the epitaxial layer may be either lightly doped P- or N-type. A MOSFET constructed in accordance with this invention can have a reduced threshold voltage and on-resistance and an increased punchthrough breakdown voltage.

6 Claims, 13 Drawing Sheets

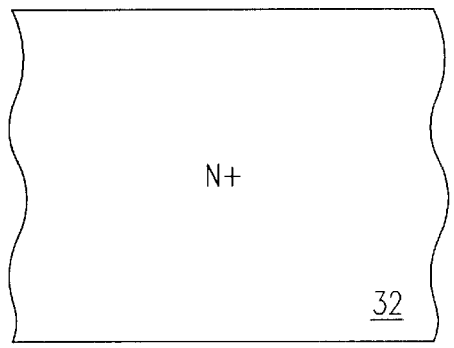
FIG. 5A
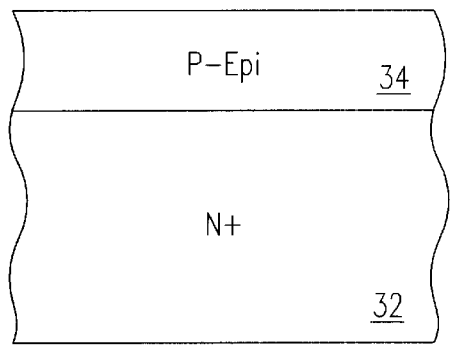
FIG. 5B
FIG. 5C
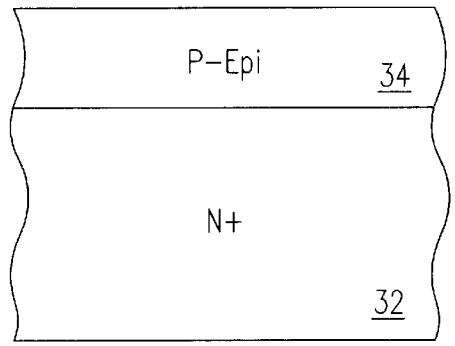
FIG. 5D
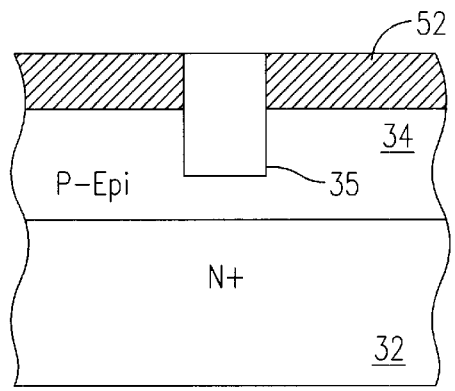
FIG. 5E
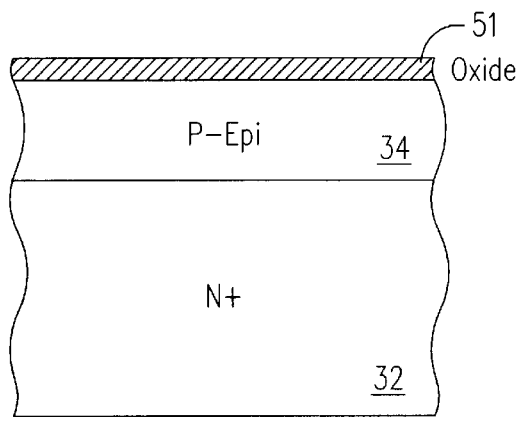
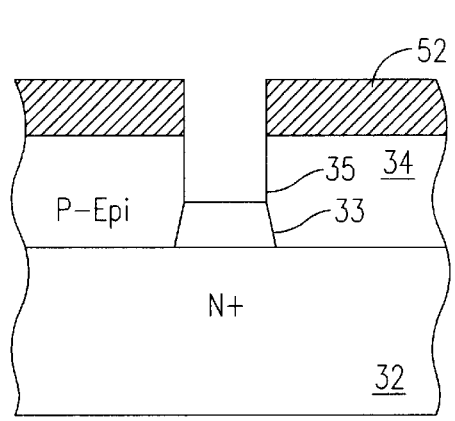
FIG. 5F

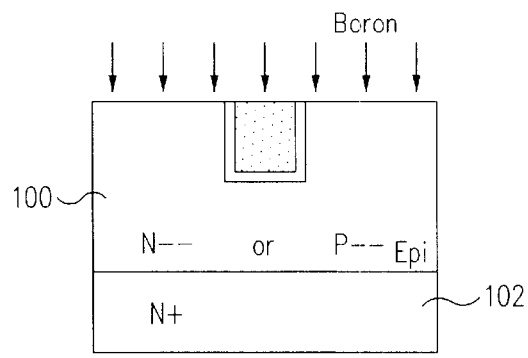
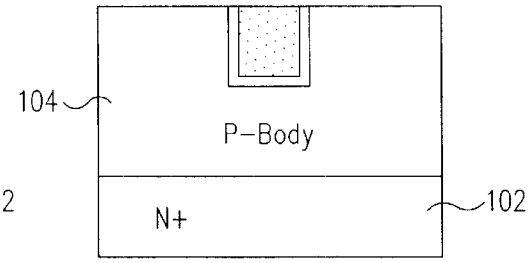
FIG. 14A        FIG. 14B
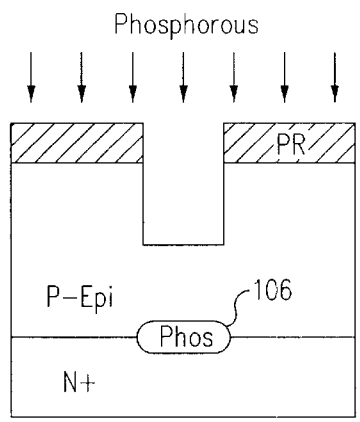
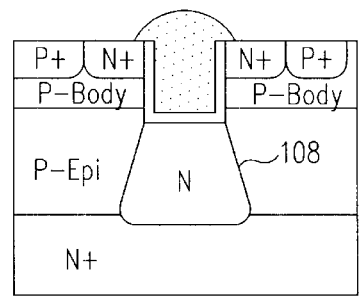
FIG. 15A        FIG. 15B
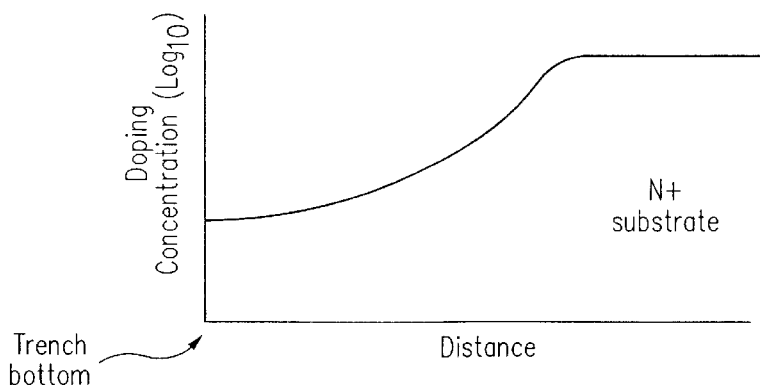
FIG. 16

PROCESS FOR MANUFACTURING TRENCH GATED MOSFET HAVING DRAIN/DRIFT REGION

This application is related to application Ser. No. 09/200, 197, filed Nov. 25, 1998, now U.S. Pat. No. 6,084,264, issued Jul. 4, 2000, which is incorporated herein by reference in its entirety.

FIELD OF IN THE INVENTION

This invention relates to power MOSFETs and in particular to a trench-gated power MOSFET with superior on-resistance and breakdown characteristics. This invention also relates to a process for manufacturing such a MOSFET.

BACKGROUND OF THE INVENTION

A conventional trench-gated power MOSFET 10 is shown in the cross-sectional view of FIG. 1. MOSFET 10 is formed in an N+ semiconductor substrate 11, on which an N-epitaxial layer 12 is grown. A gate 13 is formed in a trench 14 which extends downward from the top surface of the N-epitaxial (N-epi) layer 12. The gate is typically made of polycrystalline silicon (polysilicon) and is electrically isolated from the N-epi layer 12 by an oxide layer 15. The voltage applied to the gate 13 controls the current flowing between an N+ source 16 and a drain 18, through a channel located adjacent the wall of the trench 14 in a P-body 17. Drain 18 includes the N-epi layer 12 and N+ substrate 11. A metal contact layer 19 makes electrical contact with the N+ source 16 and with the P-body 17 through a P+ body contact region 20. A metal contact layer (not shown) typically provides an electrical connection with the bottom side of the drain 18.

Ideally, the MOSFET would operate as a perfect switch, with infinite resistance when turned off and zero resistance when turned on. In practice, this goal cannot be achieved, but nonetheless two important measures of the efficiency of the MOSFET are its on-resistance and avalanche breakdown voltage (hereinafter "breakdown voltage"). Another important criterion is where the breakdown occurs. Since the drain is normally biased positive with respect to the source, the junction 21 is reverse-biased, and avalanche breakdown normally occurs at the corner of the trench, where the electric field is at a maximum. Breakdown creates hot carriers which can damage or rupture the gate oxide layer 15. It is therefore desirable to design the device such that breakdown occurs in the bulk silicon, away from the trench 14.

Another important characteristic of a MOSFET is its threshold voltage, which is the voltage that needs to be applied to the gate in order to create an inversion layer in the channel and thereby turn the device on. In many cases it is desirable to have a low threshold voltage, and this requires that the channel region be lightly doped. Lightly doping the channel, however, increases the risk of punchthrough breakdown, which occurs when the depletion region around the junction 21 expands so as to reach all the way across the channel to the source. The depletion region expands more rapidly when the body region is more lightly doped.

One technique for reducing the strength of the electric field at the corners of the trench and promoting breakdown in the bulk silicon away from the trench is taught in U.S. Pat. No. 5,072,266 to Bulucea et al. (the "Bulucea patent") This technique is illustrated in FIG. 2, which shows a MOSFET 25, which is similar in MOSFET 10 of FIG. 1 except that a deep P+ diffusion 27 extends downward from the P-body 17 to a level below the bottom of the trench. Deep P+ diffusion 27 has the effect of shaping the electric field in such a way as to reduce its strength at the corner 29 of the trench.

While the technique of the Bulucea patent improves the breakdown performance of the MOSFET, it sets a lower limit on the cell pitch, shown as "d" in FIG. 2, because if the cell pitch is reduced too much, dopant from the deep P+ diffusion will get into the channel region of the MOSFET and increase its threshold voltage. Reducing the cell pitch increases the total perimeter of the cells of the MOSFET, providing a greater gate width for the current, and thereby reduces the on-resistance of the MOSFET. Thus, the net effect of using the technique of the Bulucea patent to improve the breakdown characteristics of the MOSFET is that it becomes more difficult to reduce the on-resistance of the MOSFET.

To summarize, the design of a power MOSFET requires that a compromise be made between the threshold and breakdown voltages and between the on-resistance and breakdown characteristics of the device. There is thus a clear need for a MOSFET structure that avoids or minimizes these compromises without adding undue complexity to the fabrication process.

SUMMARY OF THE INVENTION

In accordance with this invention a power MOSFET is formed in a semiconductor substrate of a first conductivity type which is overlain by an epitaxial layer of a second conductivity type. A trench is formed in the epitaxial layer. The power MOSFET also includes a gate positioned in the trench and electrically isolated from the epitaxial layer by an insulating layer which extends along the side walls and bottom of the trench. The epitaxial layer comprises a source region of the first conductivity type, the source region being located adjacent a top surface of the epitaxial layer and a wall of the trench; a base or body of the second conductivity type; and a drain-drift region of the first conductivity type extending from the substrate to the bottom of the trench, a junction between the drain-drift region and the body extending from the substrate to a side wall of the trench. The power MOSFET can optionally include a threshold adjust implant, and the epitaxial layer can include two or more sublayers having different dopant concentrations ("stepped epi layer").

In an alternative embodiment the trench extends through the entire epitaxial layer and into the substrate, and there is no need for the drain-drift region.

This invention also includes a process of fabricating a power MOSFET comprising providing a substrate of a first conductivity type; growing an epitaxial layer of a second conductivity type opposite to the first conductivity type on the substrate; forming a trench in the epitaxial layer; introducing dopant of the first conductivity type through a bottom of the trench to form a drain-drift region, the drain-drift region extending between the substrate and the bottom of the trench; forming an insulating layer along the bottom and a sidewall of the trench; introducing a conductive gate material into the trench; and introducing dopant of the first conductivity type into the epitaxial layer to form a source region, the drain-drift region and the source region being formed under conditions such that the source region and drain-drift region are separated by a channel region of the epitaxial layer adjacent the side wall of the trench. Alternatively, the trench can be made to extend through the epitaxial layer to the substrate.

In a variation of the process, a drain dopant is implanted to form a buried layer near the interface between the epitaxial layer and the substrate and then up-diffused until it reaches the bottom of the trench.

Alternatively, a body dopant may be implanted into a lightly doped N-- or P-- epitaxial layer and driven in until it reaches the interface between the epitaxial layer and the substrate, thereby forming a body region.

A MOSFET of this invention has several advantages, including the following. Because the drain-drift region is surrounded laterally by a second conductivity type portion of the epitaxial layer, more effective depletion occurs and more first conductivity type dopant can be put into the drain-drift region, thereby decreasing the on-resistance of the MOSFET. Because the profile of the dopant in the channel region is relatively flat, the MOSFET can be made less vulnerable to punchthrough breakdown without increasing its threshold voltage. Since the second conductivity type portions of the epitaxial layer extend to the substrate except in the areas of the drain-drift region, there is no need to form an additional second conductivity type layer for terminating the device. The separate mask for the deep diffusion of the Bulucea patent and the termination region can be eliminated. Eliminating the deep body diffusion of the Bulucea patent allows for increased cell density and reduced on-resistance.

A power MOSFET according to this invention can be fabricated in any type of cell geometry including, for example, closed cells of a hexagonal or square shape or cells in the form of longitudinal stripes.

BRIEF DESCRIPTION OF THE DRAWINGS

FIGS. 5A–5L are cross-sectional views illustrating a process of fabricating the MOSFETs of FIGS. 3 and 4.

FIGS. 14A and 14B illustrate a process in which a body dopant is implanted and driven in until it reaches the interface between the epi layer and the substrate.

FIGS. 15A and 15B illustrate a process in which a drain dopant is implanted to form a buried layer near the interface between the epi layer and the substrate and then up-diffused until it reaches the bottom of the trench.

FIG. 16 shows the general shape of the doping profile in a vertical cross-section below the trench when the drain-drift region is formed by implanting a buried layer and up-diffusing the buried layer.

DESCRIPTION OF THE INVENTION

Figure 1:
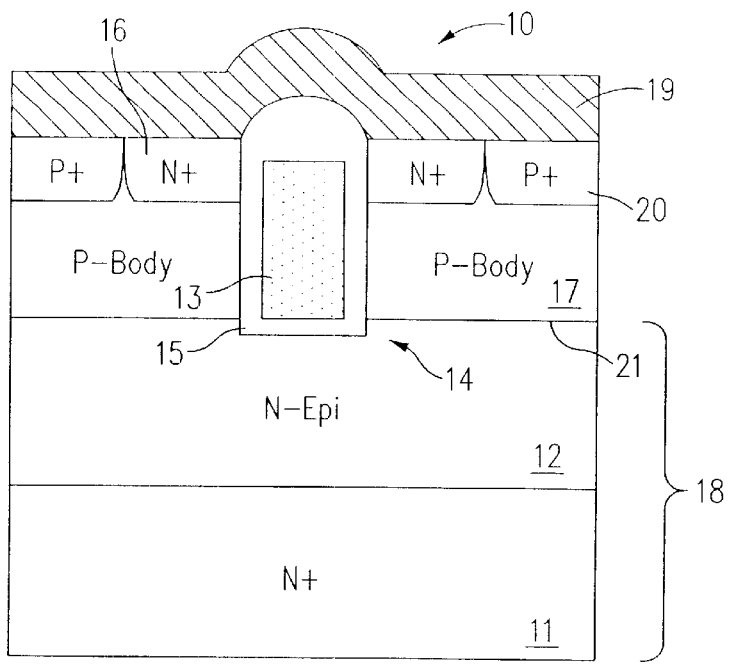
FIG. 1 is a cross-sectional view of a conventional trench-gated MOSFET.
Figure 2:
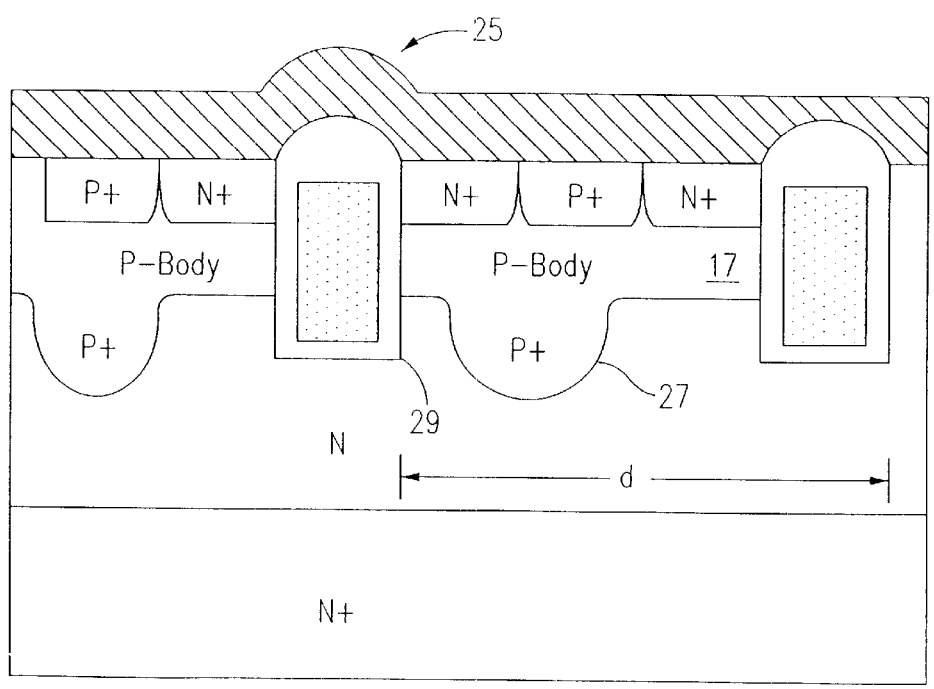
FIG. 2 is a cross-sectional view of a trench-gated MOSFET containing a deep diffusion to protect the gate oxide layer, as taught in the Bulucea patent.
Figure 3:
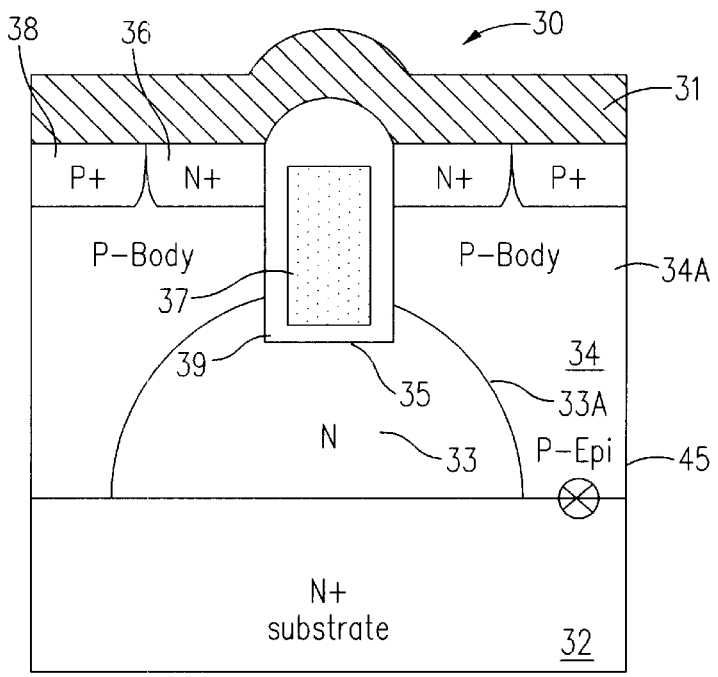
FIG. 3 is a cross-sectional view of a trench MOSFET in accordance with the invention.

A cross-sectional view of a power MOSFET in accordance with this invention is shown in FIG. 3. MOSFET 30 is formed in an N+ substrate 32 overlain by an epi layer 34, which is generally doped with a P-type impurity (hereinafter referred to as P-epi layer 34). N+ substrate 32 can have a resistivity of from $5 \times 10^{-4}$ ohm-cm to $5 \times 10^{-3}$ ohm-cm, for example, and P-epi layer 34 can be doped with boron to a concentration of from $1 \times 10^{15}$ cm$^{-3}$ to $5 \times 10^{17}$ cm$^{-3}$. N+ substrate 32 is typically about 200 microns thick and epi layer 34 could be from 2 microns to 5 microns thick.

A trench 35 is formed in P-epi layer 34 and trench 35 contains a polysilicon gate 37. Gate 37 is electrically isolated from P-epi layer 34 by an oxide layer 39 which extends along the sidewalls and bottom of the trench 35. MOSFET 30 also includes an N+ source region 36, which is adjacent a top surface of the P-epi layer 34 and a sidewall of the trench 35, and a P+ body contact region 38. The remaining portion of the P-epi layer 34 forms a P-type base or body 34A. Body 34A forms a junction with the N+ substrate 32 that is substantially coincident with the interface between the P-epi layer 34 and N+ substrate 32. A metal layer 31 makes electrical contact with N+ source region and with P-body 34A through P+ body contact region 38.

Further, in accordance with this invention an N drain-drift region 33 extends between the N+ substrate 32 and the bottom of the trench 35. A junction 33A between N drain-drift region 33 and P-body 34A extends between N+ substrate 32 and a sidewall of the trench 35. N drain-drift region can be doped, for example, with phosphorus to a concentration of from $5 \times 10^{15}$ cm$^{-3}$ to $5 \times 10^{17}$ cm$^{-3}$.

Figure 8A:
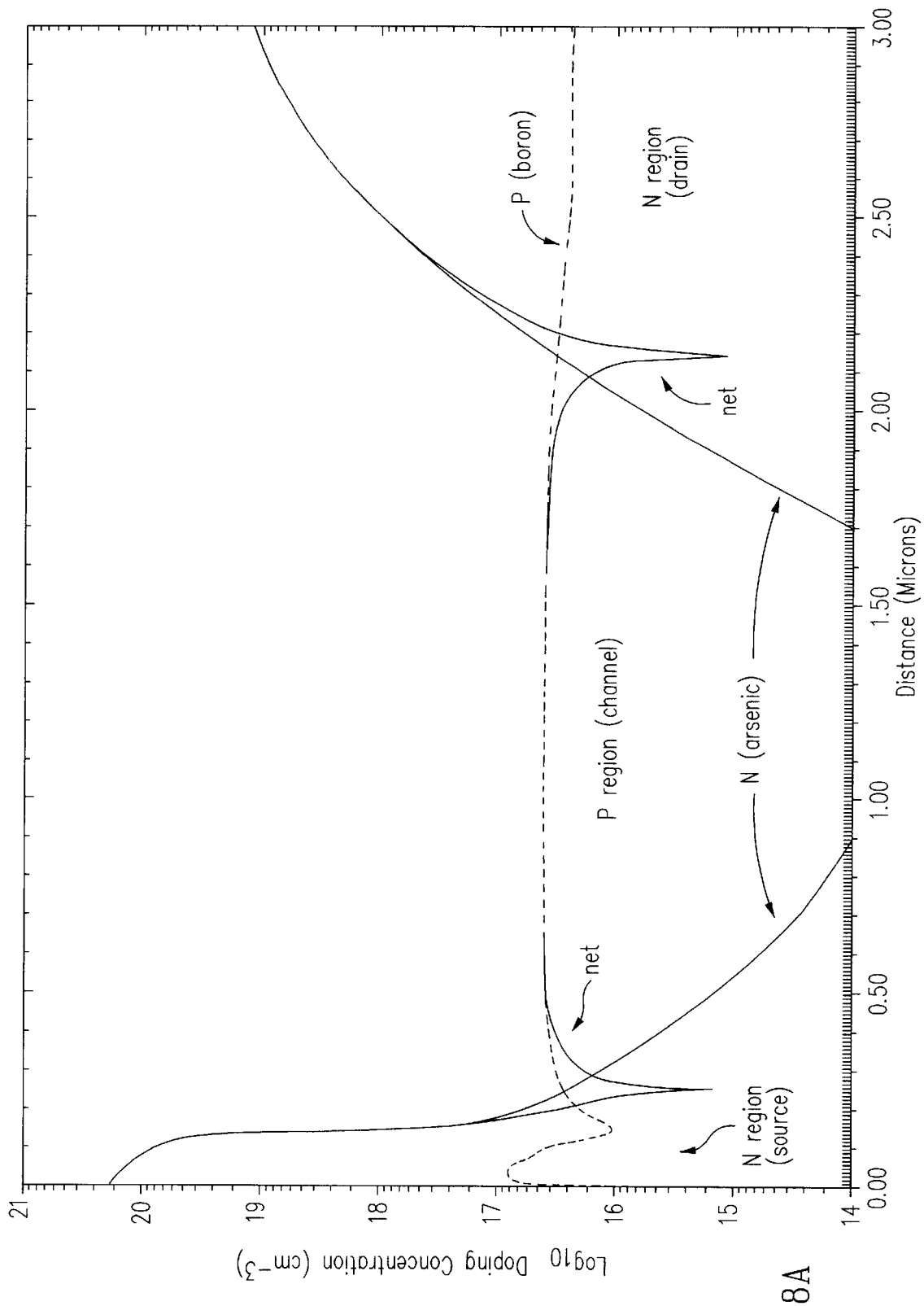
FIGS. 8A and 8B are graphs prepared using the computer simulation program SUPREME, showing the dopant concentrations in the MOSFET of FIG. 3 at vertical cross-sections through the channel region and the bottom of the trench, respectively.
Figure 8B:
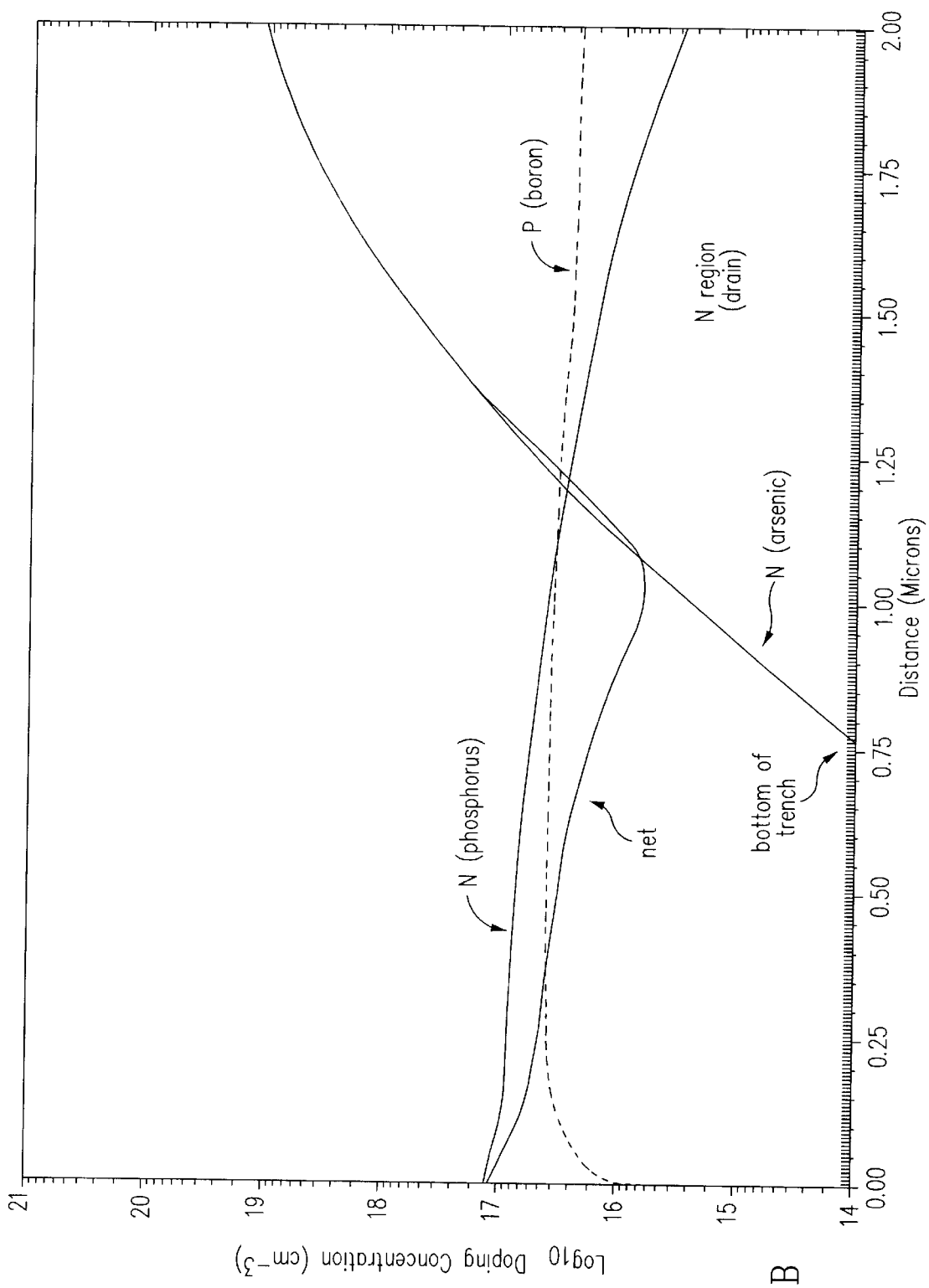

FIG. 8A is a graph of the doping concentration in MOSFET 30. The graph was prepared by the computer simulation program SUPREME and is taken at a vertical section through the channel region. The curves indicated show the doping concentrations of arsenic and boron, and the third curve shows the net doping concentration. FIG. 8B is a similar graph taken at a vertical section transecting the bottom of the trench. The horizontal axis in both graphs is the distance in microns below the surface of the P-epi layer; the vertical axis is the logarithm$_{10}$ of the doping concentration in atoms/cm$^{-3}$. Note that in FIG. 8A the concentration of boron, which is the background dopant in P-epi layer 34, is relatively flat and dominates in the channel region. The doping concentration of arsenic increases as one moves from the channel region into the source or the drain.

Figure 9A:
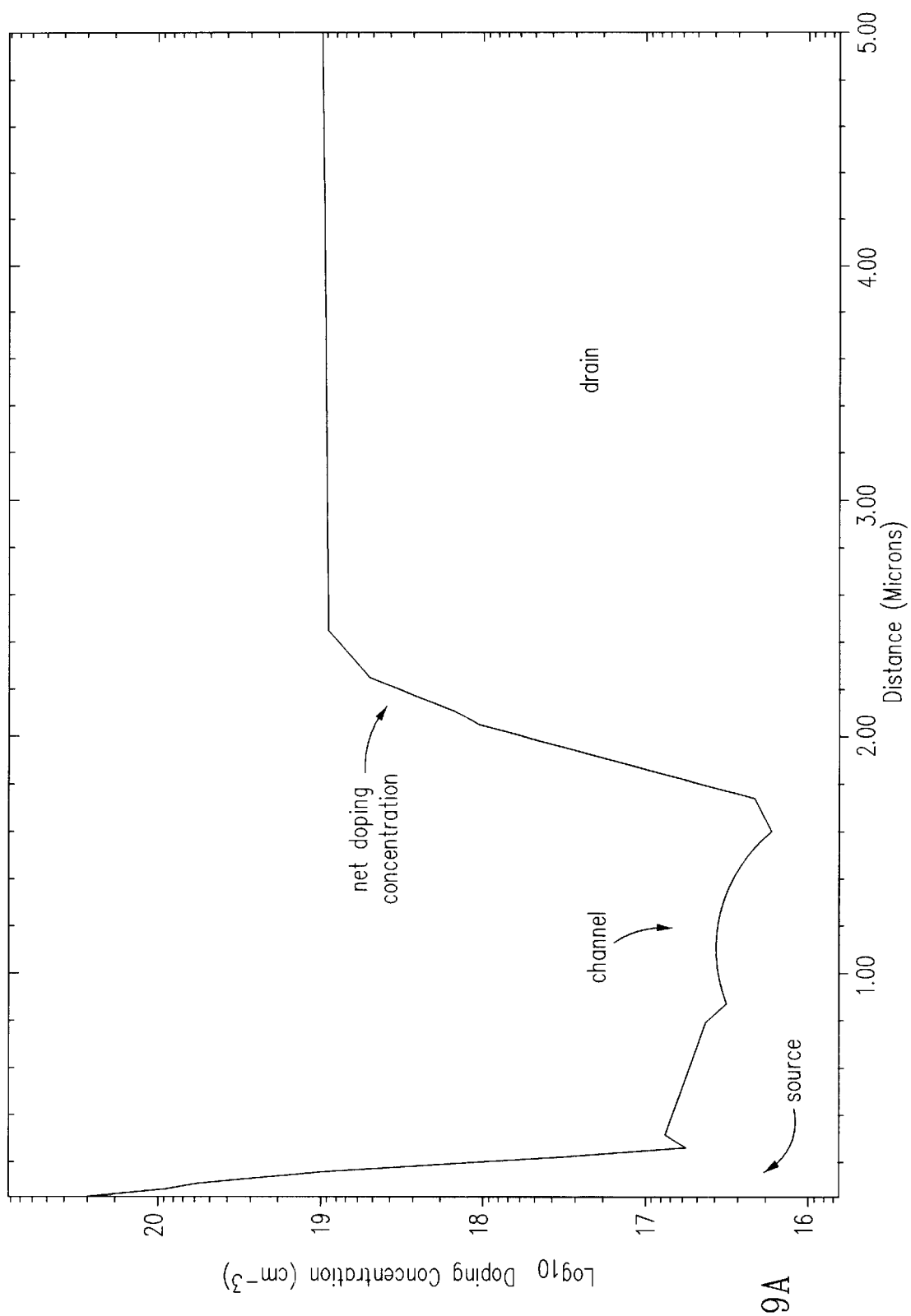
FIGS. 9A and 9B are graphs prepared using the computer simulation program MEDICI, showing the dopant concentrations in the MOSFET of FIG. 3 at vertical cross-sections through the channel region and the bottom of the trench, respectively.
Figure 9B:
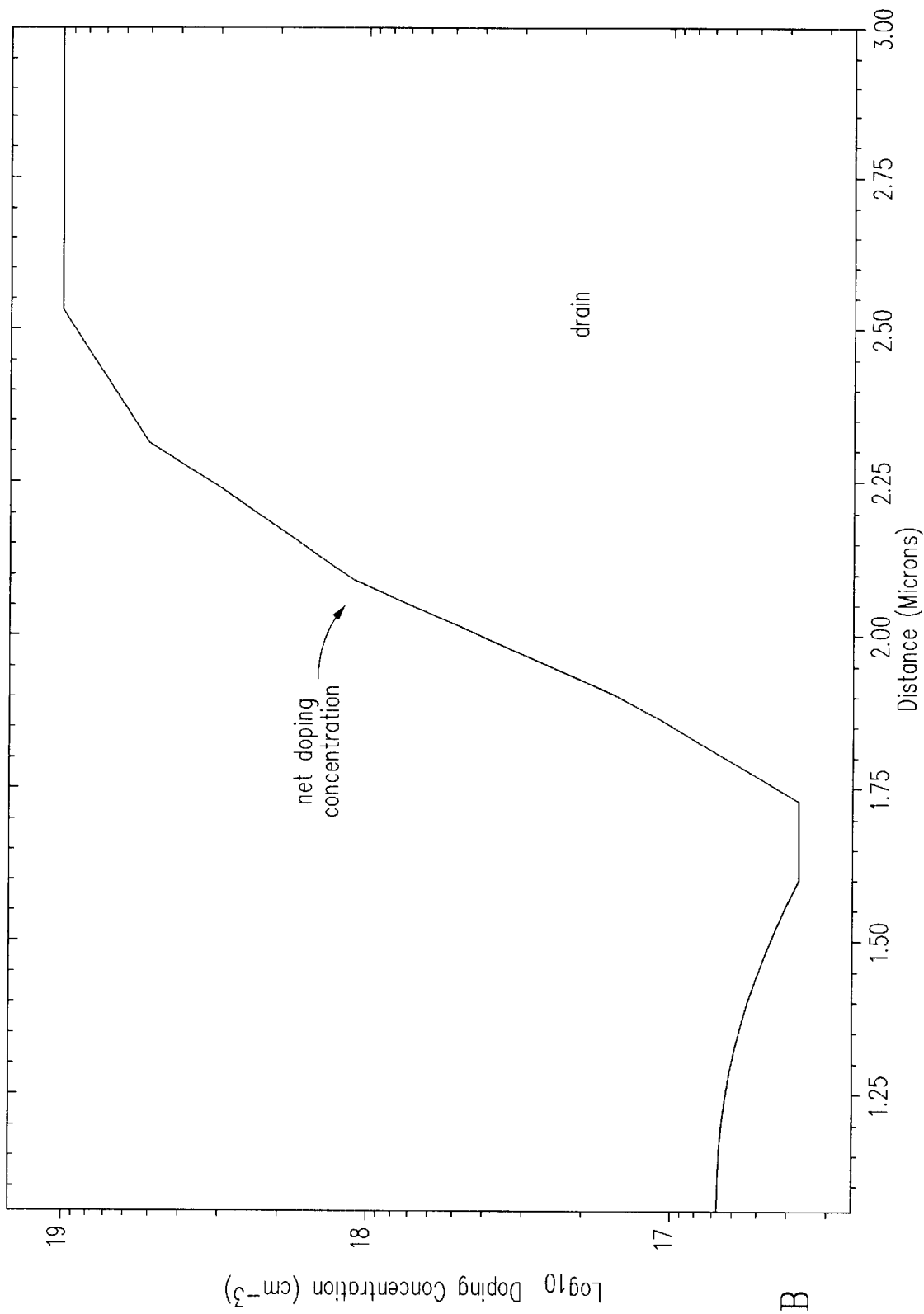

FIGS. 9A and 9B are graphs of the doping concentration at the same sections, respectively, as FIGS. 8A and 8B.

FIGS. 9A and 9B, however, were prepared using the computer simulation program MEDICI and show only the net doping concentration whether N-type or P-type.

The SUPREME and MEDICI simulations differ in that SUPREME considers only the doping concentrations at a single vertical cross-section, without taking into account the effect of dopants at other laterally displaced positions, while MEDICI takes into account all dopants in the two-dimensional plane of the drawing.

Figure 10:
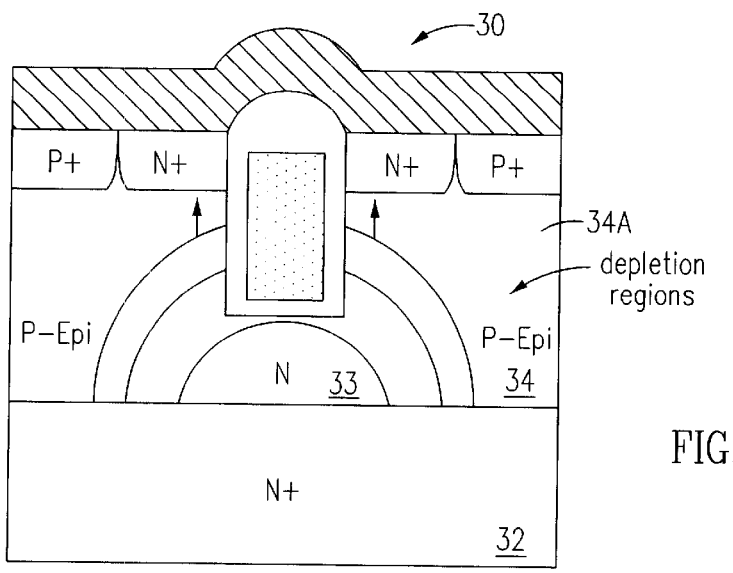
FIG. 10 illustrates the depletion regions in the MOSFET of FIG. 3 under reverse bias conditions.
Figure 11A:
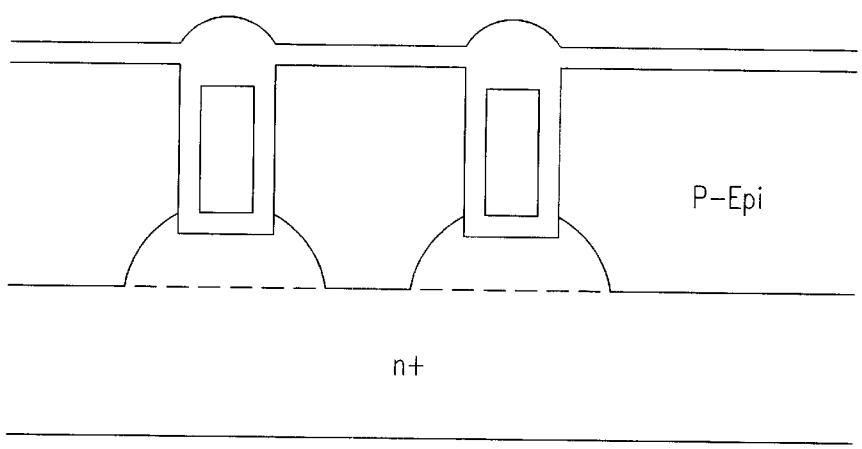
FIGS. 11A and 11B are cross-sectional views illustrating the termination region of a MOSFET according to this invention and a conventional MOSFET, respectively.
Figure 11B:
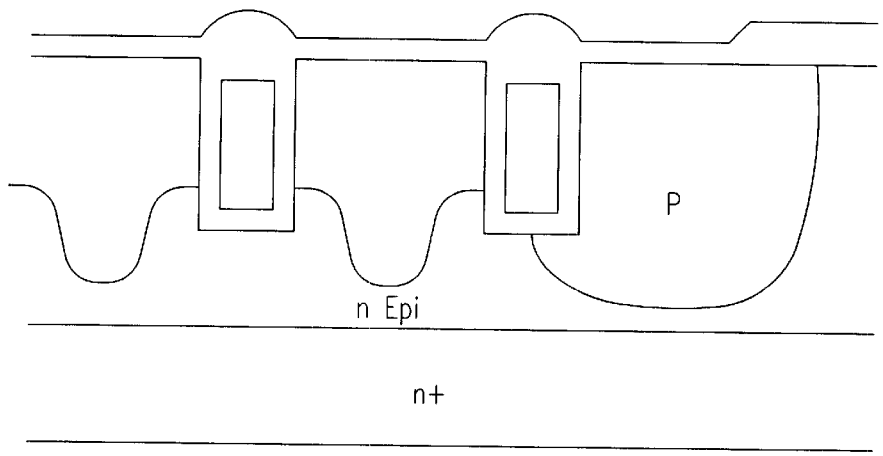
Figure 13A:
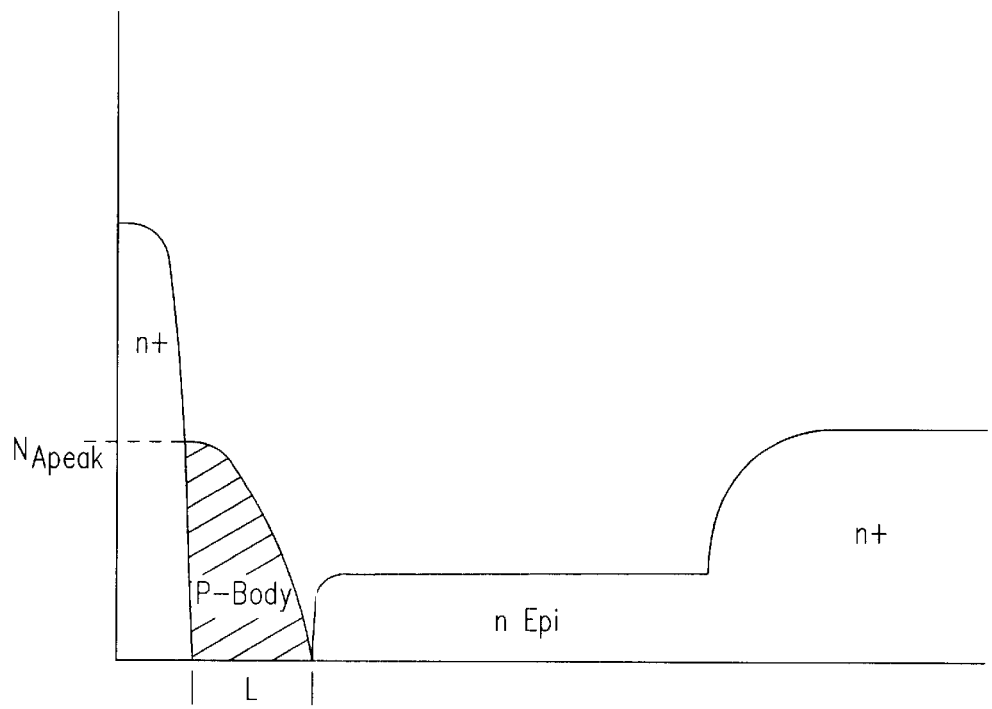
FIG. 13A is a graph of the doping profile taken at a vertical cross-section through the channel of a conventional MOSFET having a diffused P-body in an N-epi region.
Figure 13B:
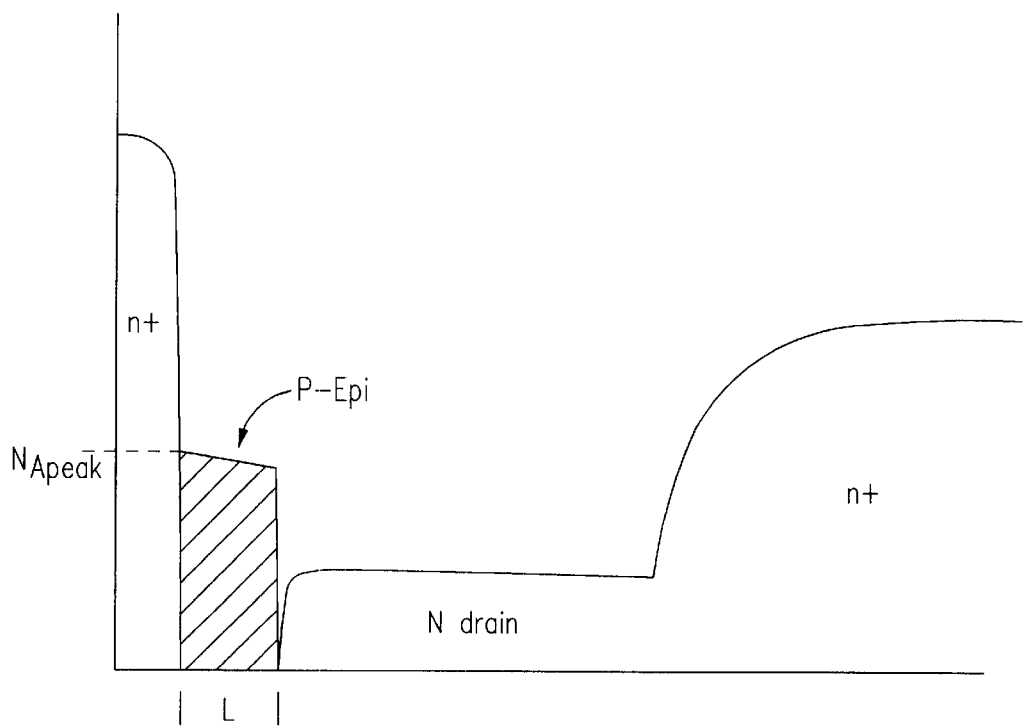
FIG. 13B is a graph of the doping profile taken at a vertical cross-section through the channel of a MOSFET according to this invention having a P-epi layer and an N drain-drift region.

The following are among the advantages of MOSFET 30:

1. Avalanche breakdown will generally occur at the interface between the N+ substrate 32 and the P-epi layer 34, away from the trench (e.g., at the location designated 45 in FIG. 3). This avoids damage to the gate oxide layer from the hot carriers generated in the area of the breakdown.
2. The gate oxide at the corners of the trench, where the electric field reaches a maximum, is protected from rupture.
3. A higher punchthrough breakdown can be obtained for a given threshold voltage. The junction between the N drain-drift region and the P-body extends downward to the N+ substrate. As shown in FIG. 10, when the MOSFET is reverse-biased the depletion regions extend along the entire junction, and as a result the depletion region in the area of the channel does not expand as quickly towards the source region (see arrows). This is the condition that causes punchthrough breakdown.
4. A higher punchthrough breakdown voltage can be obtained for a given threshold voltage. As shown in FIG. 13A, in a conventional MOSFET having a diffused body, the dopant concentration of the body falls off gradually as one approaches the N-epi (drift region). The threshold voltage is determined by the peak doping concentration $N_{A\ peak}$. The punchthrough breakdown voltage is determined by the total amount of charge $Q_{channel}$ in the channel region (represented by the area under the P-body curve in FIG. 13A). In a MOSFET of this invention, a doping profile of which is shown in FIG. 13B, the dopant profile of the P-epi layer is relatively flat. Therefore, $N_{A\ peak}$ can be the same while the total charge in the channel is greater, providing a higher punchthrough breakdown voltage.
5. Since there is no deep body diffusion in each cell (of the kind taught in the Bulucea patent) the cell pitch can be reduced without concern that additional P-type dopant will get into the channel region, raising the threshold voltage of the MOSFET. Thus the cell packing density can be increased. This reduces the on-resistance of the device.
6. In a conventional trench MOSFET a lightly-doped "drift region" is often formed between the channel and the heavily-doped substrate. The doping concentration in the drift region must be kept below a certain level because otherwise effective depletion is not obtained and the strength of the electric field at the corner of the trench becomes too great. Keeping the doping concentration in the drift region low increases the on-resistance of the device. In contrast, the N drain-drift region 33 of this invention can be doped more heavily because the shape of N drain-drift region 33 and the length of the junction between N drain-drift region 33 and P-body 34A provide more effective depletion. A more heavily doped N drain-drift region 33 reduces the on-resistance of the device.
7. As shown in FIG. 11A, there is no need for a separate P-type diffusion in the termination region of the MOSFET, since the P-epi layer extends to the N+ substrate except where the N drain regions are located. FIG. 11B shows the termination region of a conventional MOSFET which includes a P-type diffusion 110. The elimination of the P-type termination diffusion or field ring reduces the number of masking steps. For example, in the process illustrated in FIGS. 5A–5L only five masking steps are required.

Figure 4:
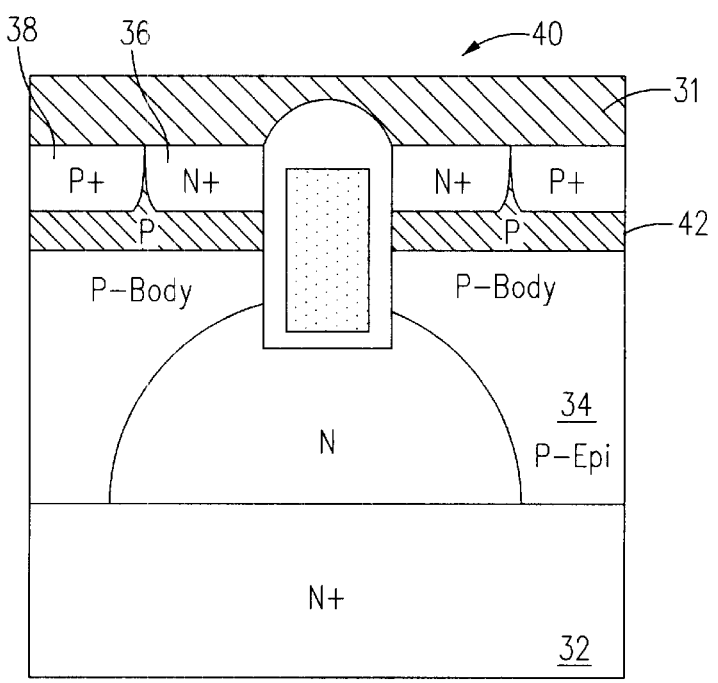
FIG. 4 is a cross-sectional view of a trench MOSFET in accordance with the invention containing a threshold adjust implant.

MOSFET 40, shown in FIG. 4, is an alternative embodiment which is similar to MOSFET 30 except that MOSFET 40 contains a threshold voltage adjust implant 42. Illustratively, such an implant would increase the threshold voltage of MOSFET 40 from 0.6 V to 1.0 V.

FIGS. 5A–5L illustrate the steps of forming MOSFETs 30 and 40.

The process begins with N+ substrate 32 (FIG. 5A), on which P-epi layer 34 is grown by a well known process (FIG. 5B). A thin oxide layer 51 is then grown on the surface of P-epi layer 34 by heating in steam at 1150° C. for about 50 minutes (FIG. 5C). Oxide layer 51 is masked and removed from the active area of the device (i.e., from the area where the active MOSFET cells are to be located) and it is left in the termination and gate pad areas.

A photoresist mask 52 is then formed on the surface of P-epi layer 34, and trench 35 is formed by a reactive ion etch (RIE) process. The process is terminated before the bottom of the trench reaches N+ substrate 32 (FIG. 5E).

Leaving photoresist mask 52 in place, phosphorus is implanted through the bottom of trench 35 at a dose of $1\times10^{13}$ cm$^{-2}$ to $1\times10^{14}$ cm$^{-2}$ and an energy of 300 keV to 3.0 MeV to produce N drain-drift region 33 (FIG. 5F). To avoid significant diffusion of the phosphorus and the consequent expansion of N drain-drift region 33, the thermal budget to which the structure is thereafter exposed is limited to the equivalent of about 950° C. for 60 minutes, or the structure can be subjected to a rapid thermal anneal (RTA) at 1050° C. for 90 seconds. In either case, N drain-drift region 33 retains essentially the compact shape shown in FIG. 5F. Advantageously, in the cross-sectional view of FIG. 5F, at least 75% and preferably 90% of the N drain-drift region 33 is located directly below the trench 35.

Figure 5G:
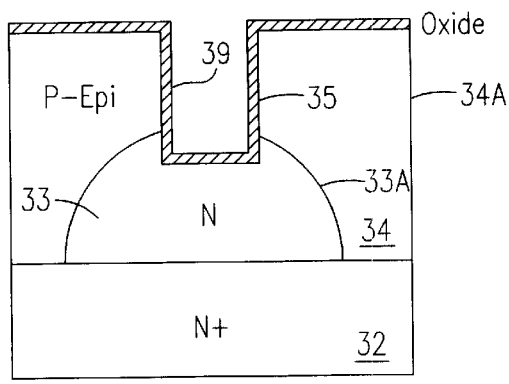
Figure 5J:
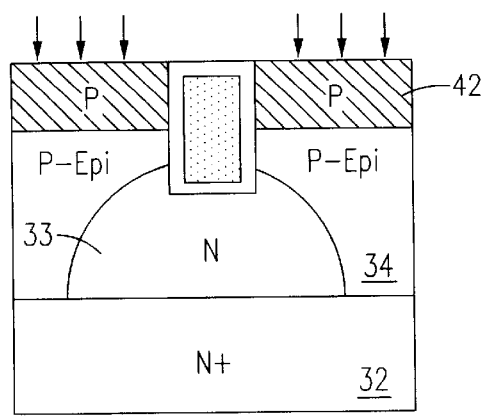

Alternatively, N drain-drift region 33 can be formed by implanting the phosphorus at a lower energy of 30 keV to 300 keV (typically 150 keV), and diffusing the phosphorus by heating at 1050° C. to 1150° C. for 10 minutes to 120 minutes (typically 1100° C. for 90 minutes), so that N drain-drift region 33 expands laterally to a shape of the kind shown in FIG. 5G.

In one variant of the process, a phosphorus buried layer 106 is formed below the trench, as shown in FIG. 15A, and a thermal process is used to up-diffuse the phosphorus until it reaches the bottom of the trench yielding a drain-drift region 108, as shown in FIG. 15B. Ideally, the buried layer 106 is located at the interface between the epi layer and the substrate, but variations in the depth of the trench and the thickness of the epi layer may cause the buried layer to be located either above the interface (e.g., if the epi layer is thick and/or the trench depth is small) or in the N+ substrate (e.g., if the epi layer is thin and/or the trench depth is large). In either case, the doping profile below the bottom of the trench, illustrated in FIG. 16, is relatively unchanged because the buried layer will be located at essentially the same distance below the trench floor. FIG. 16 shows the general shape of the doping profile in a vertical cross-section starting at the bottom of the trench. As indicated, the concentration of N-type dopant in the drain-drift region increases monotonically with increasing distance below the bottom of the trench. This is distinguishable from the doping profile below the trench in a MOSFET formed using the low-energy process, as shown in FIG. 9B, where the doping concentration initially decreases and then increases in the vicinity of the N+ substrate.

Using the high energy process and up-diffusing the N-type dopant from an implanted buried layer results in an N drain-drift region that is confined largely to the area directly below the trench and allows a smaller cell pitch. It also is easier to control and provides greater throughput.

At the conclusion of the process, whether high energy or low energy, N drain-drift region 33 extends from N+ substrate 32 to the bottom of trench 35, and the junction 33A between drain-drift region 33 and P-body 34A extends from N+ substrate 32 to a sidewall of trench 35. If the low energy process is used, the junction 33A attains the form of an arc that is concave towards the drain-drift region 33 (FIG. 5G).

Gate oxide layer 39 is then grown on the surface of P-epi layer 34 and on the bottom and sidewalls of trench 35, typically to a thickness of about 500 Å.

Figure 5H:
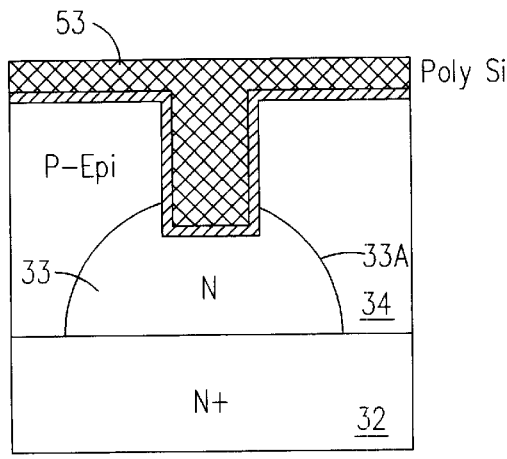

A polysilicon layer 53 is then deposited over the gate oxide layer 39, filling the trench 35 (FIG. 5H). In an N-channel MOSFET polysilicon layer 53 is typically doped with phosphorus to a concentration of $5 \times 10^{19}$ cm$^{-3}$.

Polysilicon layer 53 is etched back so that its top surface is coplanar with the surface of P-epi layer 34. An oxide layer 54 is formed on the top of the gate by thermal oxidation or deposition (FIG. 5I).

Figure 12A:
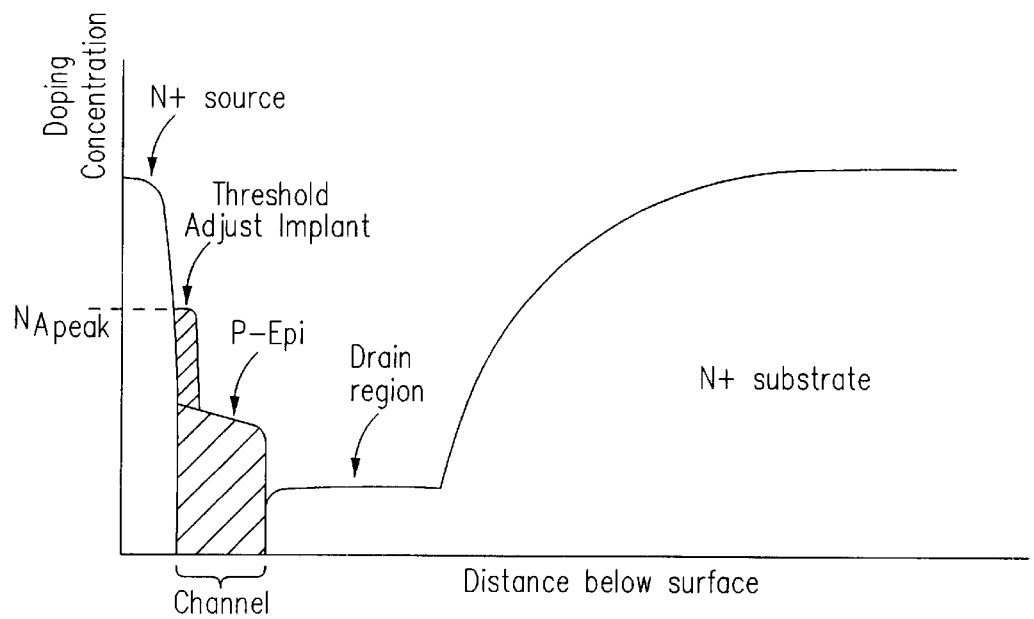
FIGS. 12A and 12B are doping profile graphs illustrating a threshold adjust implant and a body implant, respectively.

Optionally, if the threshold voltage is to be adjusted, threshold voltage adjust implant 42 is formed. Implant 42 is formed, for example, by implanting boron through the surface of P-epi layer 34 (FIG. 5J) at a dose of $5 \times 10^{12}$ cm$^{-2}$ and at an energy of 150 keV, yielding a concentration of P-type atoms of $1 \times 10^{17}$ cm$^{-3}$ in the portion of P-epi layer 34 which will form the channel of the MOSFET. FIG. 12A is a graph showing a dopant profile of a vertical cross-section taken through the channel, showing a threshold adjust implant and indicating that the threshold adjust implant is typically located in an area of the channel just below the source region. The threshold voltage of the MOSFET is determined by the peak doping concentration $N_{A\ peak}$ of the threshold adjust implant. If the threshold voltage of the device does not need to be adjusted, this step can be omitted.

Figure 12B:
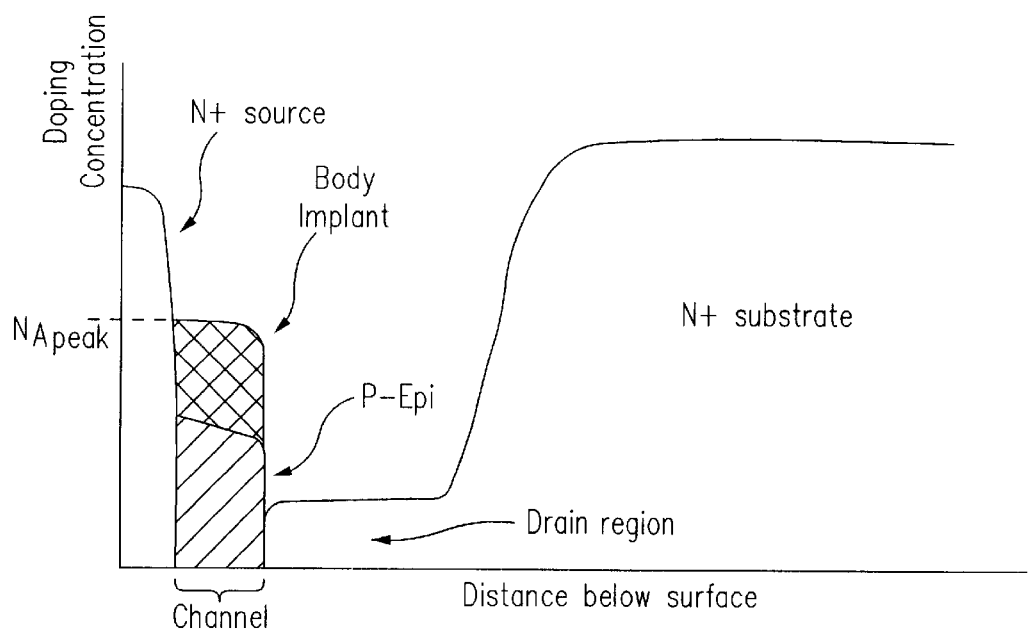

Alternatively, a body implant can be performed, as illustrated in the graph of FIG. 12B. The body implant is somewhat similar to the threshold adjust implant but the energy used is higher and as a result the body implant extends to a level near the junction between the P-epi layer and the N drain-drift region. The threshold voltage of the MOSFET is determined by the peak doping concentration $N_{A\ peak}$ of the body implant.

In another embodiment, a P-type impurity such as boron is implanted as a body dopant and is driven in until the dopant reaches the interface between the epi layer and the substrate. Such an embodiment in illustrated in FIGS. 14A and 14B. Epi layer 100 may be lightly doped with either N-type or P-type impurity. As shown in FIG. 14B, when the boron has been implanted and diffused, a P-body region 104 is formed on the N+ substrate 102.

Figure 5K:
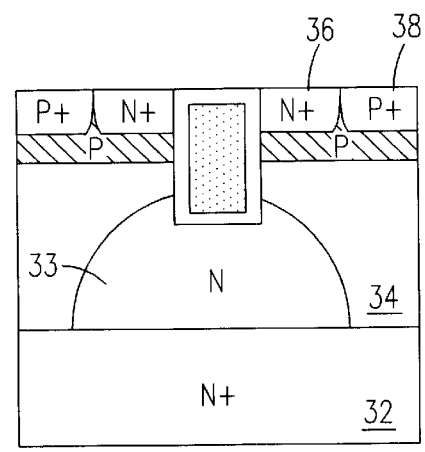
Figure 5I:
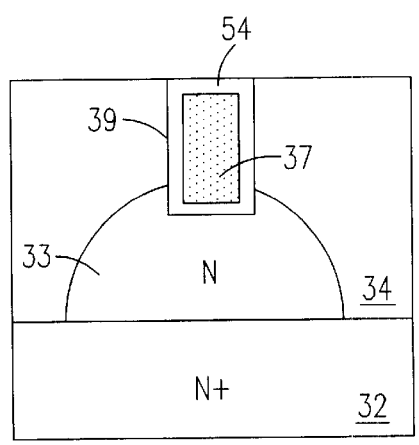
Figure 5L:
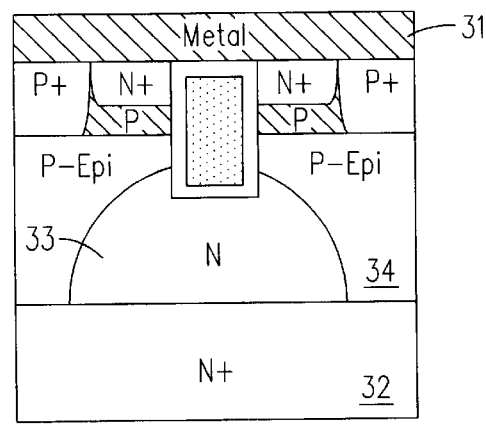

N+ source regions 36 and P+ body contact regions 38 are formed at the surface of P-epi layer 34, using conventional masking and photolithographic processes (FIG. 5K). For example, N+ source regions can be implanted with arsenic at a dose of $5 \times 10^{15}$ cm$^{-2}$ and an energy of 80 keV, yielding a concentration of $1 \times 10^{20}$ cm$^{-3}$; P+ body contact regions 38 can be implanted with boron at a dose of $1 \times 10^{15}$ cm$^{-2}$ and an energy of 60 keV, yielding a dopant concentration of $5 \times 10^{19}$ cm$^{-3}$.

Finally, metal layer 31, preferably aluminum, is deposited on the surface of P-epi layer 34 in ohmic contact with N+ source regions 36 and P+ body contact regions 38.

Figure 6:
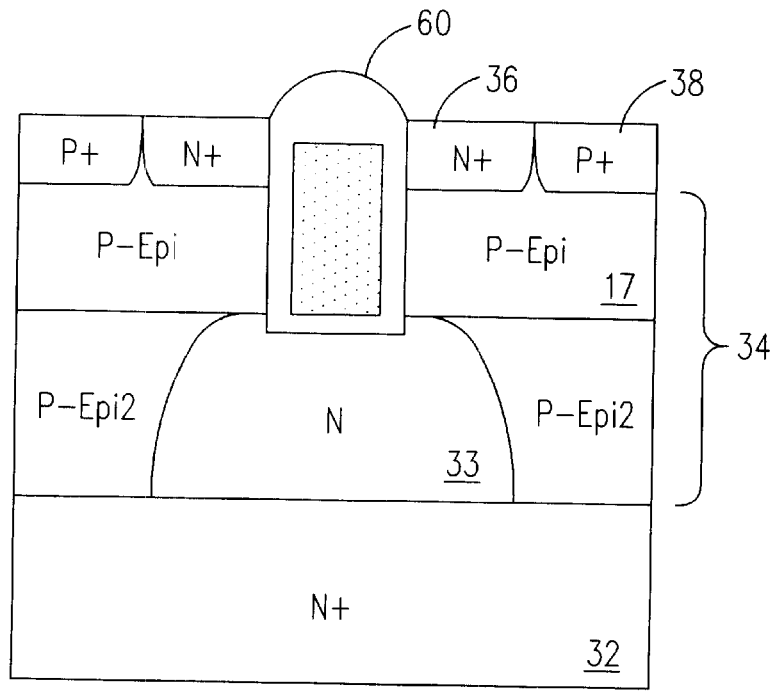
FIG. 6 is a cross-sectional view of a trench MOSFET in accordance with the invention formed in stepped epitaxial layer.

FIG. 6 shows an alternative embodiment. MOSFET 60 is similar to MOSFET 30, but P-epi layer 34 is divided into sublayers Pepi1 and Pepi2. Using a well-known process, an epi layer having sublayers can be formed by varying the flow rate of the dopant gas while the epi layer is being grown. Alternatively, sublayer Pepi1 can be formed by implanting dopant into the upper portion of the epi layer 34.

The dopant concentration of sublayer Pepi1 can be either greater than or less than the dopant concentration of sublayer Pepi2. The threshold voltage and punchthrough breakdown of the MOSFET are a function of the doping concentration of sublayer Pepi1, while the breakdown voltage and on-resistance of the MOSFET are a function of the doping concentration of sublayer Pepi2. Thus, in a MOSFET of this embodiment the threshold voltage and punchthrough breakdown voltage can be designed independently of the avalanche breakdown voltage and on-resistance P-epi layer 34 may include more than two sublayers having different doping concentrations.

Figure 7:
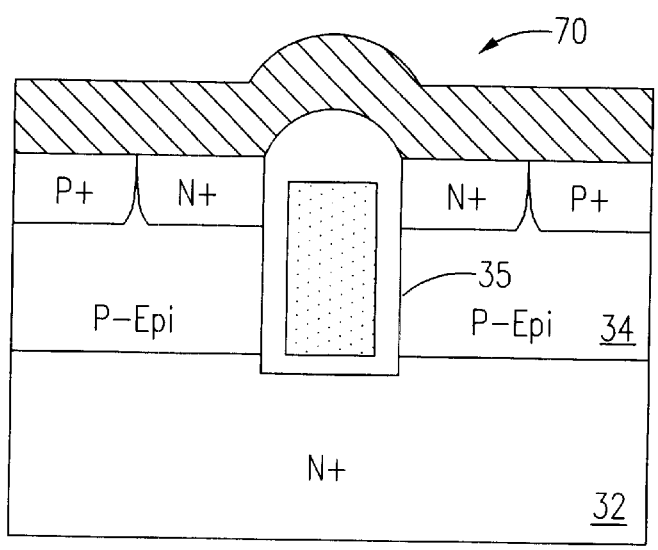
FIG. 7 is a cross-sectional view of a trench MOSFET in accordance with the invention wherein the trench extends into the heavily-doped substrate.

FIG. 7 shows another alternative embodiment. In MOSFET 70 drain-drift region 33 is omitted, and trench 35 extends entirely through P-epi layer 34 into N+ substrate 32. This embodiment is particularly suitable for low-voltage (e.g., 5 V or less) MOSFETs.

While several specific embodiments of this invention have been described, these embodiments are illustrative only. It will be understood by those skilled in the art that numerous additional embodiments may be fabricated in accordance with the broad principles of this invention. For example, while the embodiments described above are N-channel MOSFETs, a P-channel MOSFET may be fabricated in accordance with this invention by reversing the conductivities of the various regions in the MOSFET.

I claim:

1. A process of fabricating a power MOSFET comprising:

providing a substrate of a first conductivity type;

growing an epitaxial layer on the substrate;

forming a trench in the epitaxial layer;

introducing dopant of the first conductivity type through a bottom of the trench to form a buried layer below the bottom of the trench;

causing the dopant of the first conductivity type to diffuse upward until the dopant of the first conductivity reaches the bottom of the trench thereby forming a drain-drift region;

forming an insulating layer along the bottom and a sidewall of the trench;

introducing a conductive gate material into the trench; and introducing dopant of the first conductivity type into the epitaxial layer to form a source region, the drain-drift region and the source region being formed under conditions such that the source region and drain-drift region are separated by a channel region of the epitaxial layer adjacent the sidewall of the trench.

2. The method of claim 1 wherein growing an epitaxial layer comprises growing an epitaxial layer of a second conductivity type opposite to the first conductivity type on the substrate.

3. The method of claim 2 comprising implanting a body dopant of the second conductivity type into the epitaxial layer and driving the body dopant in until the body dopant reaches an interface between the epitaxial layer and the substrate.

4. The method of claim 1 wherein growing an epitaxial layer comprises growing an epitaxial layer of a first conductivity type on the substrate.

5. The method of claim 4 comprising implanting a body dopant of a second conductivity type opposite to the first conductivity type into the epitaxial layer and driving the body dopant in until the body dopant reaches an interface between the epitaxial layer and the substrate.

6. The method of claim 1 wherein introducing dopant of the first conductivity type through a bottom of the trench is performed by implanting dopant at an energy of from 300 keV to 3.0 MeV.

* * * * *